(12) United States Patent
Wu et al.

(10) Patent No.: US 10,891,010 B2
(45) Date of Patent: *Jan. 12, 2021

(54) DISPLAY DEVICE AND TOUCH DISPLAY DEVICE

(71) Applicant: Innolux Corporation, Miao-Li County (TW)

(72) Inventors: Yuan-Lin Wu, Miao-Li County (TW); Jui-Jen Yueh, Miao-Li County (TW); Hsiao-Lang Lin, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/541,166

(22) Filed: Aug. 15, 2019

(65) Prior Publication Data

US 2019/0369776 A1 Dec. 5, 2019

Related U.S. Application Data

(63) Continuation of application No. 15/453,907, filed on Mar. 9, 2017, now Pat. No. 10,430,000.

(60) Provisional application No. 62/371,252, filed on Aug. 5, 2016, provisional application No. 62/415,542, filed on Nov. 1, 2016, provisional application No. 62/429,162, filed on Dec. 2, 2016.

(51) Int. Cl.
*G06F 3/044* (2006.01)
*G06F 3/041* (2006.01)
*H01L 27/32* (2006.01)
*H01L 51/00* (2006.01)

(52) U.S. Cl.
CPC ............ *G06F 3/044* (2013.01); *G06F 3/0412* (2013.01); *H01L 27/323* (2013.01); *H01L 51/0097* (2013.01); *G06F 2203/04102* (2013.01); *H01L 27/3276* (2013.01); *H01L 2251/5338* (2013.01); *Y02E 10/549* (2013.01)

(58) Field of Classification Search
CPC .................. G06F 3/044; G06F 3/0412; G06F 2203/04102; G06F 1/1652; H01L 27/323; G09G 2380/02
See application file for complete search history.

(56) References Cited

U.S. PATENT DOCUMENTS

2014/0168109 A1* 6/2014 Kang ...................... G06F 3/044
345/173
2014/0217397 A1* 8/2014 Kwak .................. H01L 27/1218
257/43

(Continued)

FOREIGN PATENT DOCUMENTS

CN 105320382 2/2016

OTHER PUBLICATIONS

"Office Action of China Counterpart Application" dated Jul. 2, 2019, p. 1-p. 9.

*Primary Examiner* — Liliana Cerullo
(74) *Attorney, Agent, or Firm* — JCIPRNET

(57) ABSTRACT

A touch display device including a substrate, a first touch electrode, a display layer and an insulating layer is provided. The substrate includes a first bending portion. The first touch electrode is disposed over the substrate. Over the first bending portion of the substrate, the display layer is disposed between the substrate and the first touch electrode, and the insulating layer is disposed between the display layer and the first touch electrode.

20 Claims, 12 Drawing Sheets

(56) References Cited

U.S. PATENT DOCUMENTS

| | | |
|---|---|---|
| 2014/0362309 A1 | 12/2014 | Tsurusaki et al. |
| 2015/0382446 A1 | 12/2015 | Kwon et al. |
| 2016/0202831 A1* | 7/2016 | Kim .................. G06F 3/044 |
| | | 345/173 |
| 2017/0147103 A1* | 5/2017 | Han .................. G06F 1/1652 |

* cited by examiner

DISPLAY DEVICE AND TOUCH DISPLAY DEVICE

CROSS-REFERENCE TO RELATED APPLICATION

This is a continuation application of a prior application Ser. No. 15/453,907, filed on Mar. 9, 2017, now allowed. The prior application Ser. No. 15/453,907 claims the priority benefits of U.S. provisional application Ser. No. 62/371,252, filed on Aug. 5, 2016, U.S. provisional application Ser. No. 62/415,542, filed on Nov. 1, 2016, and U.S. provisional application Ser. No. 62/429,162, filed on Dec. 2, 2016. The entirety of each of the above-mentioned patent applications is hereby incorporated by reference herein and made a part of this specification.

BACKGROUND OF DISCLOSURE

1. Field of the Disclosure

The present invention generally relates to a touch display device, in particular, to a bent touch display device.

2. Description of Related Art

A touch display device is becoming more and more popular in the market, and the application of the touch display device is wider and wider. For integrating the touch sensing function and the image displaying function in an electronic device, a touch panel allowing the display light to pass through is attached onto a display panel through an adhesive layer. However, the attachment of the touch panel increases the thickness of the electronic device and causes a restriction on the reliability of the electronic device. For example, the touch panel may be peeled off from the display panel when an external force is applied to the electronic device. In addition, the increased thickness may restrict the mechanical property such as the flexibility of the electronic device.

SUMMARY OF THE DISCLOSURE

An embodiment of the present disclosure provides a touch display device including a substrate, a first touch electrode, a display layer and an insulating layer is provided. The substrate includes a first bending portion. The first touch electrode is disposed over the substrate. Over the first bending portion of the substrate, the display layer is disposed between the substrate and the first touch electrode, and the insulating layer is disposed between the display layer and the first touch electrode.

Based on the above, the touch display device can have the display function and the touch sensing function in the bending portion and have good reliability.

To make the above features and advantages of the disclosure more comprehensible, embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
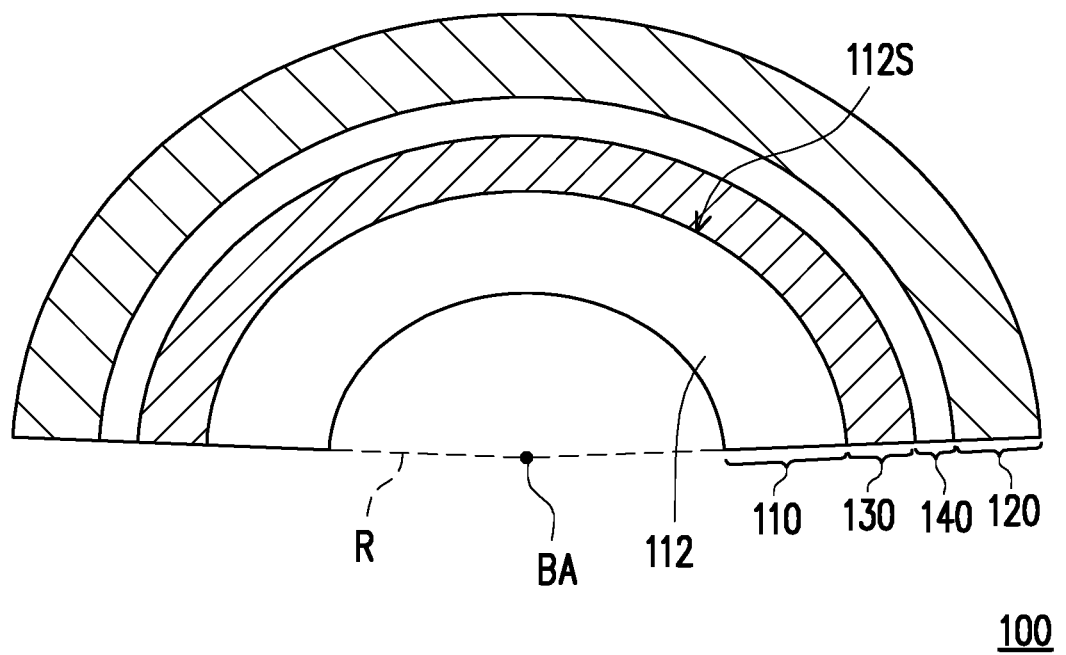
FIG. 1 is a schematic cross sectional view of a part of a touch display device according to an embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

FIG. 1 is a schematic cross sectional view of a part of a touch display device according to an embodiment of the present disclosure. Referring to FIG. 1, a touch display device 100 includes a substrate 110, a first touch electrode 120, a display layer 130 and an insulating layer 140. The substrate 110 includes a bending portion 112 which is formed by bending the substrate 110 to have a curved surface 112S. Over the bending portion 112, the display layer 130 is disposed between the substrate 110 and the first touch electrode 120, and the insulating layer 140 is disposed between the display layer 130 and the first touch electrode 120.

In an embodiment, the substrate 110 can be a flexible substrate. The display layer 130, the insulating layer 140 and the first touch electrode 120 can be sequentially fabricated on the substrate 110 when the substrate 110 is flat in an unbent status and even attached onto a rigid support. Thereafter, the substrate 110 with the first touch electrode 120, the display layer 130 and the insulating layer 140 disposed thereon can be bent according to a predetermined shape. For example, the substrate 110 can be bent about a bending axis BA and the curvature radius R is determined based on the use and/or application of the touch display device 100. Accordingly, the bending portion 112 can have the curved surface 112S, and the first touch electrode 120, the display layer 130 and the insulating layer 140 are curved in accordance with the curved surface 112S.

The first touch electrode 120 can sense touch activity of a user. The first touch electrode 120 can perform a mutual-capacitive touch sensing function, a self-capacitive touch sensing function, a resist type touch sensing function or the like. The pattern layout of the first touch electrode 120 can be determined based on the type of touch sensing function. In addition, the first touch electrode 120 can be fabricated on the insulating layer 140 without using an adhesive technique. Therefore, the first touch electrode 120 may less likely be peeled off from the touch display device 100 when bending the touch display device 100. In other words, the touch display device 100 has a touch on display structure so as to involve better reliability and compact volume.

The display layer 130 can include a plurality of display pixels for displaying an image. The display layer 130 can display an image in response to the touch sensing result of the first touch electrode 120 in one example. Alternatively, the display layer 130 can display an image based on the instruction of a driving unit (not shown). The display layer 130 can include a self-luminous display pixel capable of emitting the display light, or a non self-luminous display pixel capable of adjusting an incident light and allowing the adjusted light to be transmitted outwardly to construct the display light. The self-luminous display pixel may include an organic light emitting diode (OLED) pixel, a quantum dot pixel, a micro LED pixel, or the like. The non self-luminous display pixel may include an electrophoresis display pixel, an electro-wetting display pixel, a liquid crystal display pixel, or the like. When the display layer 130 includes the non self-luminous display pixel, the touch display device 100 can further include a light source; alternatively, the non self-luminous display pixel may display image by reflecting the external light without equipped with a light source.

The insulating layer 140 between the display layer 130 and the first touch electrode 120 can serve as a layer isolating the display layer 130 and the first touch electrode 120 as well as a layer protecting the display layer 130. In one example, the insulating layer 140 can provide the gas-water barrier function to protect the display layer 130 from being damaged by the invading gas or water if needed. The insulating layer 140 can have a single layer structure or a multi-layers structure. For example, the insulating layer 140 can include organic material, inorganic material, or a mixture of organic and inorganic material. The inorganic material suitable for use can be an oxide such as silicon oxide, a nitride such as silicon nitride, an oxy-nitride such as silicon oxy-nitride, or a combination thereof can be adopted. For organic material, a resin material, a photoresist material, a polymer or a combination thereof can be adopted.

Figure 2:
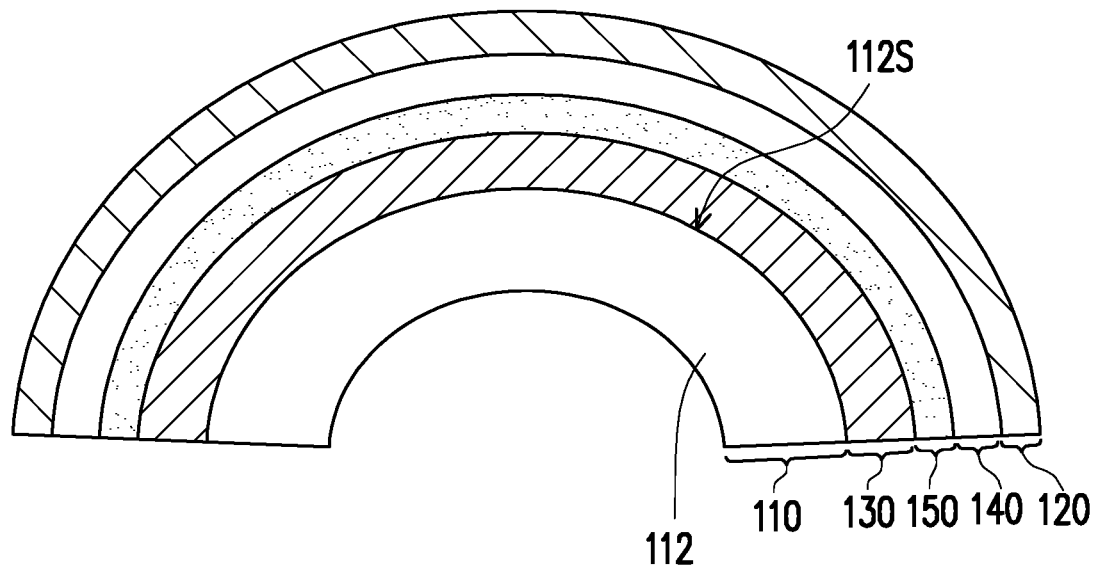
FIG. 2 is a schematic cross sectional view of a part of a touch display device according to another embodiment of the present disclosure.

FIG. 2 is a schematic cross sectional view of a part of a touch display device according to another embodiment of the present disclosure. Referring to FIG. 2, a touch display device 200, similar to the touch display device 100, includes a substrate 110, a first touch electrode 120, a display layer 130 and an insulating layer 140, and further includes a second touch electrode 150. The disposition relationship and the functions of the substrate 110, the first touch electrode 120, the display layer 130 and the insulating layer 140 can refer to the detailed descriptions for the embodiment of FIG. 1 and are not reiterated here. The second touch electrode 150 can be disposed between the insulating layer 140 and the substrate 110, and curved in accordance with the curved surface 112S over the bending portion 112 of the substrate 110. In one embodiment, the insulating layer 140 can be used for isolating the first touch electrode 120 from the second touch electrode 150 so that the first touch electrode 120 and the second touch electrode 150 are not in direct contacted with each other. The first touch electrode 120 and the second touch electrode 150 can be coupled mutually to perform a mutual capacitive touch sensing function. Alternatively, the first touch electrode 120 and the second touch electrode 150 can individually perform the touch sensing function.

In the present embodiment, the display layer 130 can include a plurality of elements and the second touch electrode 150 can be formed in the same layer of one element of the display layer 130. Therefore, though the drawing presents the second touch electrode 150 and the display layer 130 as individual layers, the second touch electrode 150 can be formed by the same layer as one layer of the display layer 130. For example, the display layer 130 can include an electrode layer and a conductive layer. The second touch electrode 150 can be formed by the same layer as the electrode layer in the display layer. Or, the second touch electrode 150 can be formed by the same layer as the conductive layer in the display layer. The touch display device 200 can be considered as a hybrid touch display device.

Figure 3:
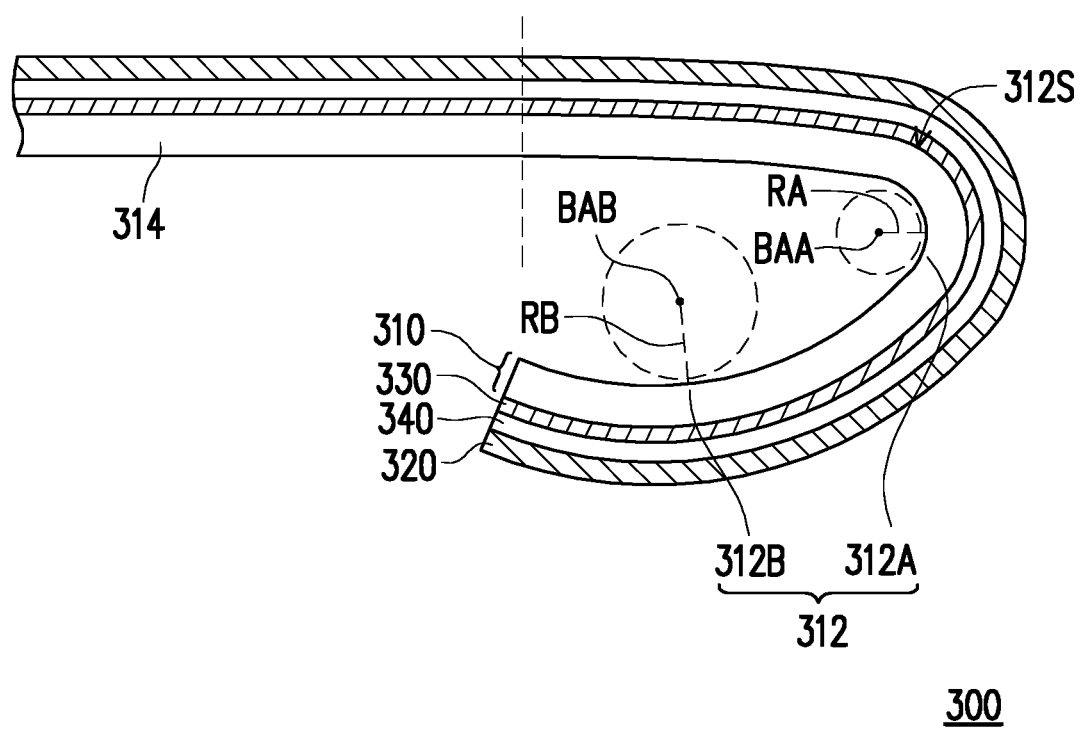
FIG. 3 is a schematic cross sectional view of a part of a touch display device according to further another embodiment of the present disclosure.

FIG. 3 is a schematic cross sectional view of a part of a touch display device according to further another embodiment of the present disclosure. Referring to FIG. 3, a touch display device 300 includes a substrate 310, a first touch electrode 320, a display layer 330 and an insulating layer 340. The first touch electrode 320 is disposed over the substrate 310. The display layer 330 is disposed between the first touch electrode 320 and the substrate 310. The insulating layer 340 is disposed between the first touch electrode 320 and the display layer 330. In addition, the substrate 310 includes a first bending portion 312 and a main portion 314. The first bending portion 312 is located at a side of the main portion 314.

The substrate 310 can be made of flexible material and capable of being bent into a desired shape. The first bending portion 312 can be considered as a bent portion of the substrate 310 while the main portion 314 can be considered as an unbent portion of the substrate 310. In some embodiments, the main portion 314 can be flat. However, in other embodiments, the main portion 314 can be not flat and include uneven or curved surface. The first bending portion 312 can have greater bending extent than the main portion 314. In other words, a greatest curvature of the first bending portion 312 is greater than a greatest curvature of the main portion 314.

The bending process can be conducted before the display device is presented to the consumers (or users). FIG. 3 shows the state of the display device, in which the substrate 310 has been bent. Alternatively, according to some embodiments, when a flexible substrate is used as the substrate, the bending process can be conducted by the consumer. That is, originally, the substrate of the display device can be flat, and then the consumer can bend the substrate to have the bent portion according to requirement, thus obtaining the display device as shown in FIG. 3. In the disclosure, the bending portion can mean a portion that has been bent, or a portion that will be bent by the consumers.

According to some embodiments, the first bending portion 312 of the substrate 310 can have at least two curvatures. For example, as shown in FIG. 3, the first bending portion 312 can include a first curved section 312A and a second curved section 312B. The first curved section 312A is curved about the bending axis BAA with a curvature radius RA. The second curved section 312B is curved about the bending axis BAB with a curvature radius RB. In the present embodiment, the curvature radius RA of the first curved section 312A is different from the curvature radius RB of the second curved section 312B. Herein, FIG. 3 though shows that the curvature radius RA is smaller than the curvature radius RB and the first curved section 312A is closer to the main portion 314 than the second curved section 312B, the disclosure is not limited thereto. The curvature variation of the first bending portion 312 can be determined based on the requirement of design and application.

The first touch electrode 320, the display layer 330 and the insulating layer 340 can be disposed on both the first bending portion 312 and the main portion 314. Over the first bending portion 312, the first touch electrode 320, the display layer 330 and the insulating layer 340 are curved in accordance with the curved surface 312S. In one example, the display layer 330 as well as the first touch electrode 320 can continuously extend from the first bending portion 312 to the main portion 314. Thus, the display layer 330 and the first touch electrode layer 320 are disposed in the main portion 314 and the first bending portion 312. Accordingly, in the touch display device 300, the touch and display functions can be achieved at both the first bending portion 312 and the main portion 314. Alternatively, the first touch electrode 320 may include a first part in the first bending portion 312 and a second part in the main portion 314, the first part and the second part can perform touch sensing function individually. For example, the first part can perform the self-capacitance touch sensing function and the second part can perform the mutual-capacitance touch sensing function.

For having the touch sensing function, the touch display device 300 includes the first touch electrode 320 over both the first bending portion 312 and the main portion 314, but not limited thereto. In an alternative embodiment, the touch display device 300 can further include a second touch electrode such as the second touch electrode 150 depicted in FIG. 2 over at least one of the first bending portion 312 and the main portion 314. In addition, the first touch electrode 320 may be omitted over the main portion 314, such that the touch sensing function may not provide over the main portion 314 or the touch sensing function over the main portion 314 may be achieved by other types of touch sensing element.

Figure 4A:
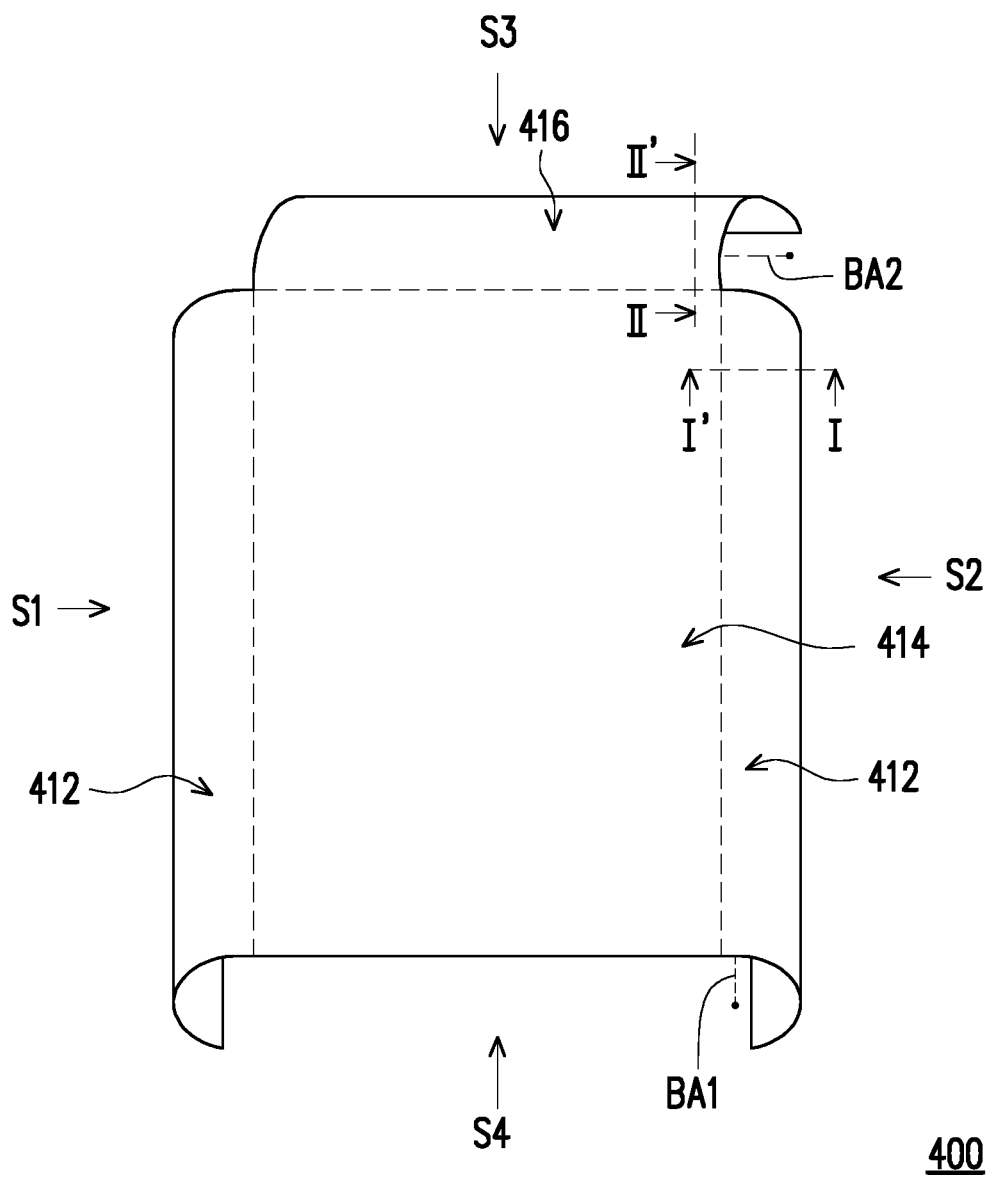
FIG. 4A is a schematic top view of a touch display device according to an embodiment of the disclosure.
Figure 4B:
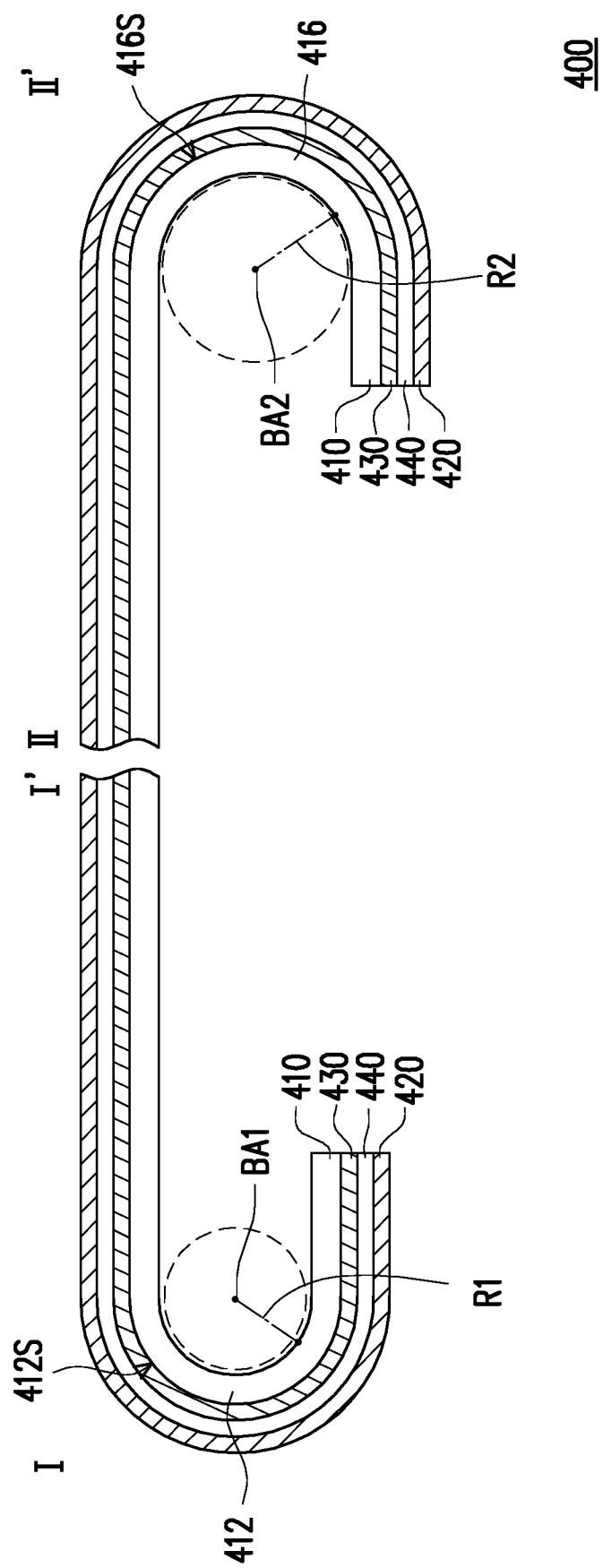
FIG. 4B is a schematic cross sectional view of the touch display device of FIG. 4A taken along line I-I' and line II-II' in FIG. 4A.

FIG. 4A is a schematic top view of a touch display device according to an embodiment of the disclosure and FIG. 4B is a schematic cross sectional view of the touch display device of FIG. 4A taken along line I-I' and line II-II' in FIG. 4A. Referring to FIG. 4A and 4B, the touch display device 400 includes a substrate 410, a first touch electrode 420, a display layer 430 and an insulating layer 440. The first touch electrode 420 is disposed over the substrate 410. The display layer 430 is disposed between the first touch electrode 420 and the substrate 410. The insulating layer 440 is disposed between the first touch electrode 420 and the display layer 430. In addition, the substrate 410 includes at least one first bending portion 412, a main portion 414 and a second bending portion 416.

Referring to FIG. 4, the main portion 414 includes four sides S1, S2, S3, and S4. The first side S1 is opposite to the second side S2, and the third side S3 is opposite to the fourth side S4. The first side S1 is next to the third side S3. The first bending portion 412 is located at the first side S1 of the main portion 414, and the second bending portion 416 is located at the third side S3. In addition, the first touch electrode 420, the display layer 430 and the insulating layer 440 can be disposed over at least one of the first bending portion 412, the main portion 414 and the second bending portion 416. As shown in FIG. 4A, the touch display device 400 having two first bending portions 412 at two opposite sides (S1 and S2) of the main portion 414 is taken as an example, but the disclosure is not limited thereto. In other examples, the touch display device 400 can have only one first bending portion 412 at a side of the main portion 414.

As shown in FIGS. 4A and 4B, the main portion 414 is substantially a flat plane while the first bending portion 412 and the second bending portion 416 are curved with respective to the main portion 414. Namely, a greatest curvature of the first bending portion 412 and a greatest curvature of the second bending portion 416 are respectively greater than a greatest curvature of the main portion 414. In addition, the greatest curvature of the second bending portion 416 can be the same or different from the greatest curvature of the first bending portion 412. Specifically, the first bending portion 412 is bent about a bending axis BA1 with a curvature radius R1, the second bending portion 416 is bent about a bending axis BA2 with a curvature radius R2. As shown in FIG. 4B, the curvature radius R1 of the first bending portion 412 is smaller than the curvature radius R2 of the second bending portion 416. However, the extent of the curvature rate of the first bending portion 412 and the second bending portion 416 can be adjusted according to various requirements or applications.

The display function and the touch sensing function can be performed over the first bending portion 412 and/or the second bending portion 416. However, it is not necessary to have the display and the touch sensing functions over both the first bending portion 412 and the second bending portion 416 in some examples. In addition, the driving unit such a driving IC (not shown) can be disposed on the second bending portion 416 and electrically communicated with the first touch electrode 420 and the display layer 430, such that the second bending portion 416 may not involve the display function and the touch sensing function, but provide for an external component to be bonded thereto.

For having the touch sensing function, the touch display device 400 is configured with the first touch electrode 420 over the first bending portion 412, the main portion 414 and the second bending portion 416, but not limited thereto. The first bending portion 412 has a curved surface 412S and the second bending portion 416 has a curved surface 416S. Over the first bending portion 412, the first touch electrode 420, the display layer 430 and the insulating layer 440 are curved in accordance with the curved surface 412S of the first bending portion 412. Over the second bending portion 416, the first touch electrode 420, the display layer 430 and the insulating layer 440 are curved in accordance with the curved surface 416S of the second bending portion 416. In an alternative embodiment, the touch display device 400 can further include a second touch electrode such as the second touch electrode 150 depicted in FIG. 2 over at least one of the first bending portion 412, the main portion 414 and the second bending portion 416, such that the first touch electrode 420 and the second touch electrode can perform the mutual capacitive touch sensing function by capacitive coupled to each other.

In the previous embodiments, the substrate 110, 310 or 410 can be made of flexible material, such that the touch electrode, the display layer and the insulating layer can be fabricated on the substrate 110, 310 or 410 by using the deposition process, the printing process, the deposition process combined with the patterning process, or the like when the substrate 110, 310 or 410 is unbent and can be curved along with the substrate 110, 310 or 410 when the substrate 110, 310 or 410 is bent. In an example, the substrate 110, 310 or 410 is folded or bent into a predetermined shape. The bent substrate 110, 310 or 410 can be selectively attached onto a stereo object or frame having a curved structure to maintain the bent shape. Alternatively, a rigid support (not shown) can be attached to the substrate 110, 310 or 410 and the bent shape of the substrate 110, 310 or 410 can be maintained by fixing the rigid support. Furthermore, the substrate 110, 310 or 410 can be bent by a user's operation.

Figure 5:
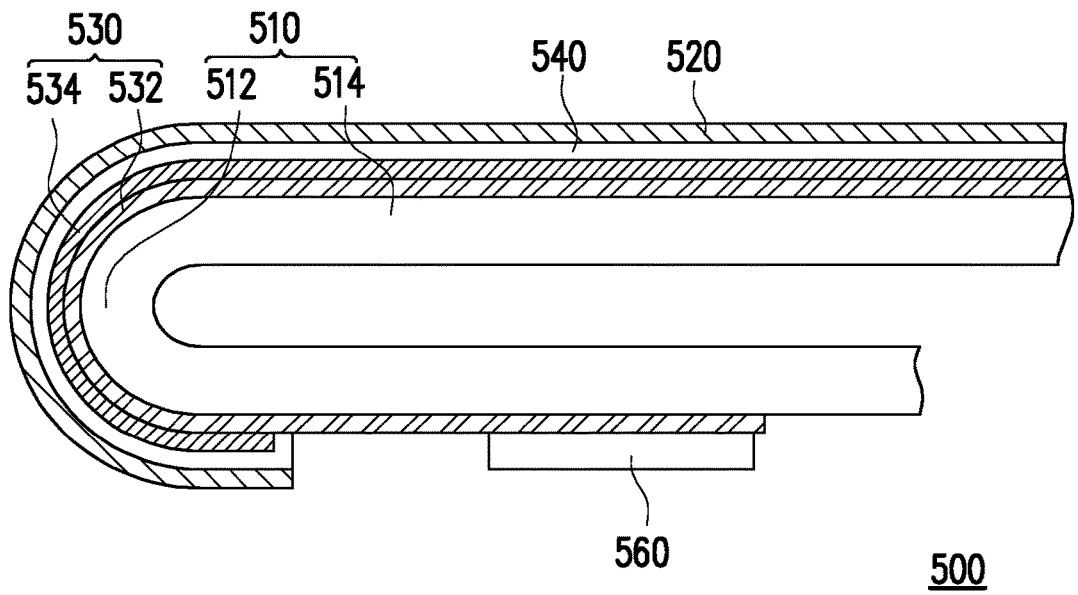
FIG. 5 is a schematic drawing showing a part of the touch display device in a bent status according to an embodiment of the disclosure.

FIG. 5 is a schematic drawing showing a part of the touch display device in a bent status according to an embodiment of the disclosure. Referring to FIG. 5, the touch display device 500 includes a substrate 510, a first touch electrode 520, a display layer 530, an insulating layer 540 and a driving unit 560. The substrate 510 is bendable and/or foldable, and in a bent status, the substrate 510 includes a first bending portion 512 and a main portion 514, wherein the first bending portion 512 has a curvature greater than the main portion 514. The first touch electrode 520, the display layer 530, and the insulating layer 540 are formed over the substrate 510 and disposed on both the first bending portion 512 and the main portion 514. Over the first bending portion 512, the first touch electrode 520, the display layer 530, and the insulating layer 540 are curved along with the curvature of the first bending portion 512. In the thickness direction, the display layer 530 is disposed between the substrate 510 and the first touch electrode 520, and the insulating layer 540 is disposed between the first touch electrode 520 and the display layer 530. In addition, the driving unit 560 can be disposed on the first bending portion 512 of the substrate 510 and can be proximate to an edge of the substrate 510. The driving unit 560 can be integrated circuit (IC) and electrically communicated with the display layer 530 and the first touch electrode 520. The driving unit 560 can include a driving circuit therein to control the display function of the display layer 530 and/or the touch sensing function of the first touch electrode 520.

The display layer 530 can include a driving layer 532 and a display medium layer 534, where the driving layer 532 is more adjacent to the substrate 510 than the display medium layer 534. The driving layer 532 further extends outwardly from the display medium layer 534 for connecting to the driving unit 560. In addition, the display medium layer 534 can include display medium units, and the driving layer 532 can include driving element units. Each display medium unit can be driven by one driving element unit to emit the display light as a display pixel. The display medium unit can be an organic light emitting diode unit, a micro LED unit, a quantum dot unit, an electrophoresis medium unit, an electro-wetting medium unit, or the like. The driving element unit can include at least one thin film transistor and at least one capacitor.

The first touch electrode 520 can extend outwardly from the edge of the display medium layer 534, such that the touch display device 500 can have a touch region larger than the display region, which is helpful to enhance the edge touch sensing accuracy. In addition, the insulating layer 540 also extends outwardly from the edge of the display medium layer 534, such that the insulating layer 540 can encapsulate the sidewall of the display medium layer 534 to prevent the display medium layer 534 from the invading water and gas.

Figure 6:
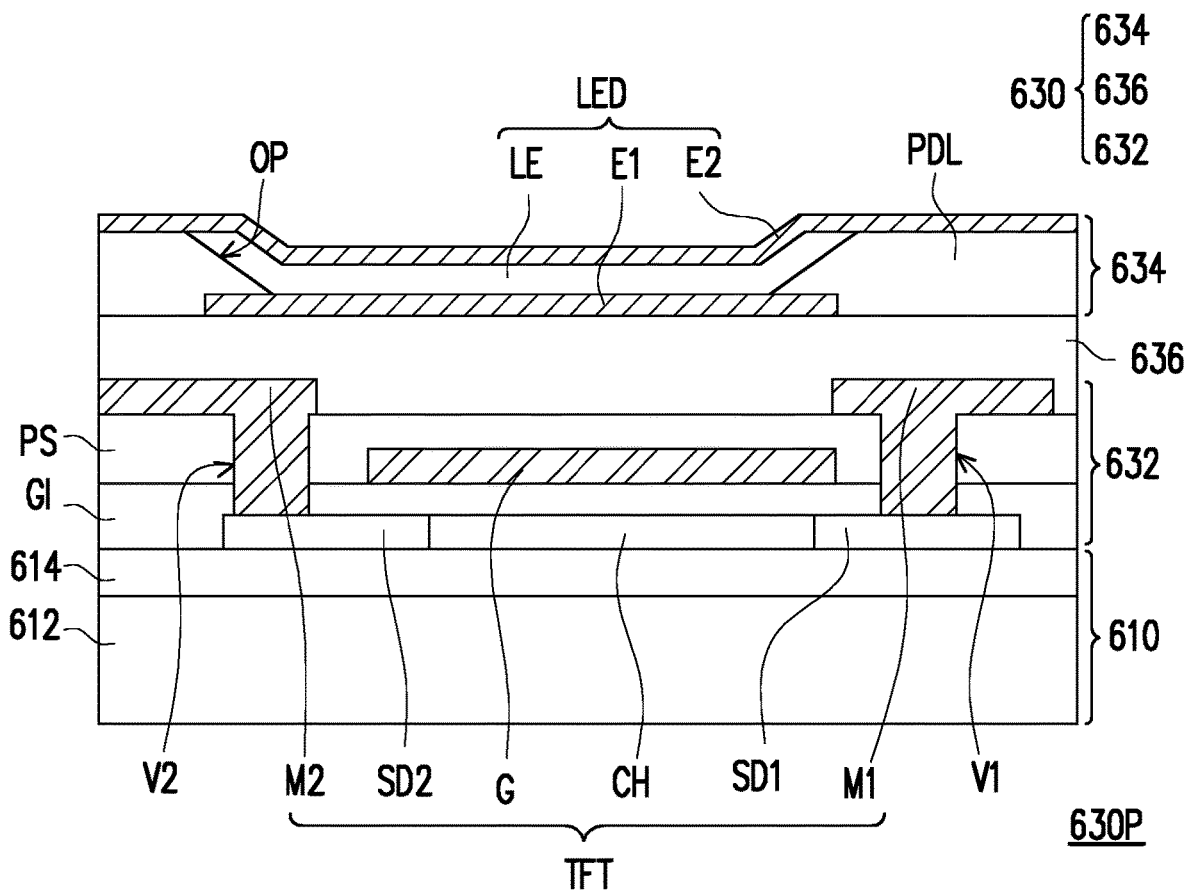
FIG. 6 is a schematic cross sectional view showing a portion of a display pixel in the display layer of a touch display device according to an embodiment of the present disclosure.

Specifically, the display layer in any of the above touch display devices can include a plurality of display pixels arranged in an array. FIG. 6 is a schematic cross sectional view showing a portion of a display pixel in the display layer of a touch display device according to an embodiment of the present disclosure. Referring to FIG. 6, the display pixel 630P includes a substrate 610 and a display layer 630 on the substrate 610. The display layer 630 can include a driving layer 632, a display medium layer 634 and a dielectric layer 636 interposed between the driving layer 632 and the display medium layer 634. The driving layer 632 is disposed on the substrate 610 exemplarily including a substrate body 612 and a buffering layer 614 between the substrate body 612 and the driving layer 632. The dielectric layer 636 is interposed between the driving layer 632 and the display medium layer 634, and the display pixel 630P can further includes a conducting structure (not shown) electrically connecting the driving layer 632 and the display medium layer 634, so that the driving layer 632 can drive the display medium layer 634 to emit a display light.

In FIG. 6, the driving layer 632 includes at least one thin film transistor TFT. The thin film transistor TFT includes, for example, a gate G, a channel region CH, a first source drain region SD1, a second source drain region SD2, a first conductor M1 (as a source or drain electrode) and a second conductor (as a source or drain electrode) M2. The channel region CH, the first source drain region SD1 and the second source drain region SD2 are formed by a semiconductor structure, where the first source drain region SD1 and the second source drain region SD2 are located at opposite sides of the channel region CH, and the first source drain region SD1 and the second source drain region SD2 can have better conductivity than the channel region CH. A gate insulation layer GI is formed between the channel region CH and the gate G while the orthogonal projection area of the gate G on the substrate 610 overlaps the orthogonal projection area of the channel region CH on the substrate 610. Above the gate G, a passivation layer PS is formed. The first conductor M1 and the second conductor M2 are formed on the passivation layer PS and respectively connects to the first source drain region SD1 and the second source drain region SD2 through a first contact via V1 and a second contact via V2 passing through the passivation layer PS and the gate insulation layer GI. The dielectric layer 636 is disposed on the driving layer 632 and covers the first conductor M1 and the second conductor M2.

The display medium layer 634 in the present embodiment includes a first electrode E1, a second electrode E2 and a light emitting layer LE to form a light emitting diode structure LED. The light emitting layer LE can be an organic light emitting layer, a micro LED layer, or a quantum dot layer. In addition, a pixel define layer PDL is formed on the dielectric layer 636 to define the disposition location of the light emitting diode structure LED. The first electrode E1 is formed on the dielectric layer 636, and the pixel define layer PDL is disposed on the first electrode E1, where the pixel define layer PDL has an opening OP exposing at least a portion of the first electrode E1. The light emitting layer LE is disposed on the first electrode E1 in the opening OP of the pixel define layer PDL. The second electrode E2 is disposed on the light emitting layer EL and extends outwardly from the top of the light emitting layer EL to overlap the pixel define layer PDL. Herein, the first electrode E1 can serve as an anode and the second electrode E2 can serve as a cathode, but the disclosure is not limited thereto. Or, the first electrode E1 can serve as a cathode and the second electrode E2 can serve as an anode. The second electrode E2 can be formed by a transparent conductive layer so that the light emitting diode structure LED can be a top emission type emitting structure.

The thin film transistor TFT though does not directly connect to the light emitting diode structure LED in FIG. 6, is one component of the driving layer 632 for driving the light emitting diode structure LED. In one example, the driving layer 632 can include two transistors plus one capacitor (2T1C), six transistors plus one capacitor (6T1C), seven transistors plus two capacitors (7T2C), or the like to drive the light emitting diode structure LED of the display medium layer 634. In addition, the material of the light emitting layer EL can include organic light emitting material so that the display pixel 630P can be an organic light emitting diode (OLED) pixel, but the disclosure is not limited thereto. In an alternative example, the light emitting layer EL can be selectively doped with quantum dots therein so as to provide a quantum dot display function. The display pixel 630P can be applied to any of the touch display devices disclosed in the present disclosure. For example, in the case the display pixel 630P is applied to the touch display device 500, the driving layer 632, the display medium layer 634 and the dielectric layer 636 can serve as the specific implemental structures of the display layer 530.

Figure 7:
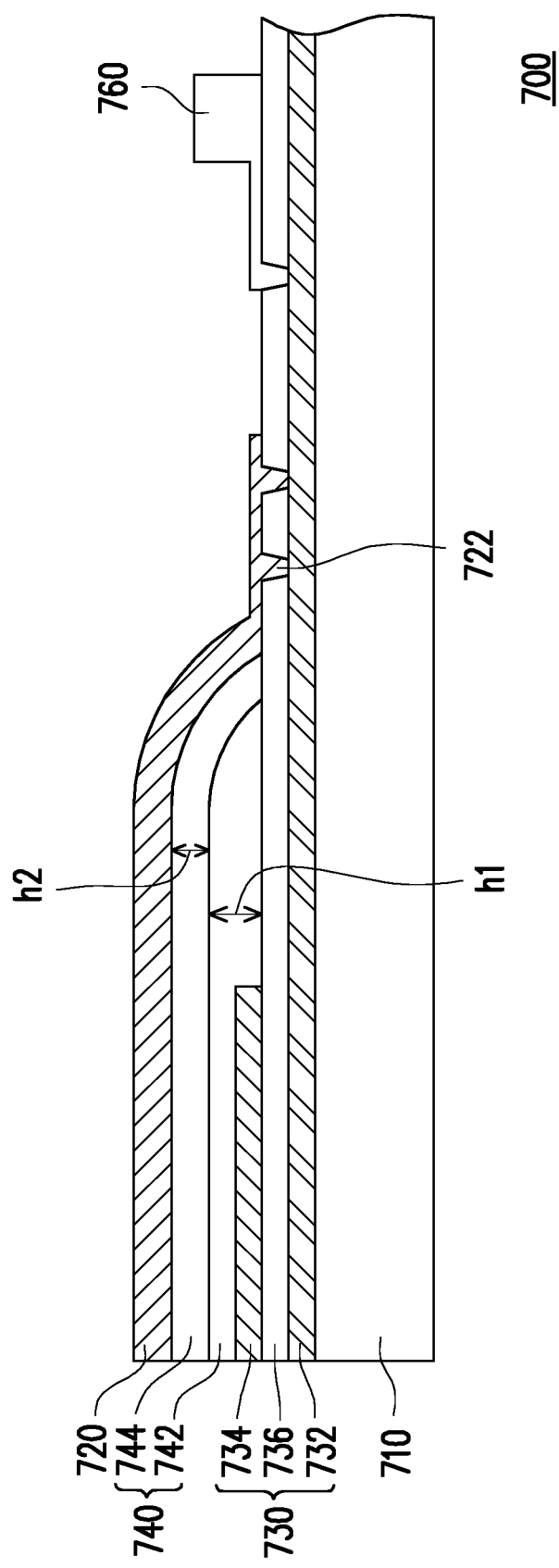
FIG. 7 is a schematic drawing showing a part of the touch display device according to an embodiment of the disclosure.

FIG. 7 is a schematic drawing showing a part of the bending portion of the touch display device according to an embodiment of the disclosure. Referring to FIG. 7, the touch display device 700 includes a substrate 710, a first touch electrode 720, a display layer 730, an insulating layer 740 and a driving unit 760. The substrate 710 can be bendable and/or foldable or bent to form a bending portion, but the drawing presents the portion of the substrate 710 in an unbent status. The first touch electrode 720, the display layer 730, and the insulating layer 740 are formed over the substrate 710, where the display layer 730 is disposed between the substrate 710 and the first touch electrode 720, and the insulating layer 740 is disposed between the first touch electrode 720 and the display layer 730. In addition, the driving unit 760 can be disposed on the bending portion of the substrate 710 and electrically communicated with the display layer 730 and the first touch electrode 720. The driving unit 760 can include a driving circuit therein to control the display function of the display layer 730 and/or the touch sensing function of the first touch electrode 720.

The display layer 730 can include a driving layer 732, a display medium layer 734 and a dielectric layer 736, where the dielectric layer 736 is disposed between the driving layer 732 and the display medium layer 734, and the driving layer 732 is more adjacent to the substrate 710 than the display medium layer 734. The display medium layer 734 is driven by the driving layer 732. In addition, the driving layer 732 extends outwardly from the display medium layer 734 for connecting to the driving unit 760. The dielectric layer 736 can also extend outwardly from the display medium layer 734 for protecting the driving layer 732.

The insulating layer 740 in the present embodiment can include an organic layer 742 and an inorganic layer 744 sequentially stacked over the display layer 730, where a greatest thickness of the organic layer 742 is a first thickness h1, a greatest thickness of the inorganic layer 744 is a second thickness h2, and the first thickness h1 is greater than the second thickness h2. The insulating layer 740 extends outwardly from the edge of the display medium layer 734 in a manner that the organic layer 742 covers the side of the display medium layer 734 and the inorganic layer 744 covers the side of the organic layer 742, such that the insulating layer 740 can encapsulate the sidewall of the display medium layer 734 to prevent the display medium layer 734 from the invading water and gas at the side direction. In other embodiments, the insulating layer 740 can further include other inorganic layers and/or other inorganic layers, where the organic layers and the inorganic layers are stacked alternatively to form a gas-water barrier structure. In some embodiments, the insulating layer 740 can be a three layer structure, which include two inorganic layers and one organic layer. The organic layer is disposed between two inorganic layers.

In FIG. 7, the first touch electrode 720 can extend outwardly from the edge of the display medium layer 734 over the insulating layer 740, such that the touch display device 700 can have a touch region larger than the display region, which is helpful to enhance the edge touch sensing accuracy. In addition, the first touch electrode 720 is formed on the inorganic layer 744 while the organic layer 742 may not contact with the first touch electrode 720. The first touch electrode 720 can include at least one connecting structure 722 passing through the dielectric layer 736, and the first touch electrode 720 can be connected to the driving layer 732 via the connecting structure 722. Accordingly, the driving layer 732 can transmit the touch sensing signal between the driving unit 760 and the first touch electrode 720. Therefore, the driving layer 732 may not merely be used for driving the display medium layer 734 but also providing the signal transmission function for the first touch electrode 720. In one embodiment, the driving unit 760 can be integrated with the touch sensing control/driving circuit and the display control/driving circuit. Alternatively, the touch display device 700 may include two driving units separately, in which one driving unit is for the touch sensing control/driving function, and the other driving unit is for the display control/driving function.

Figure 8:
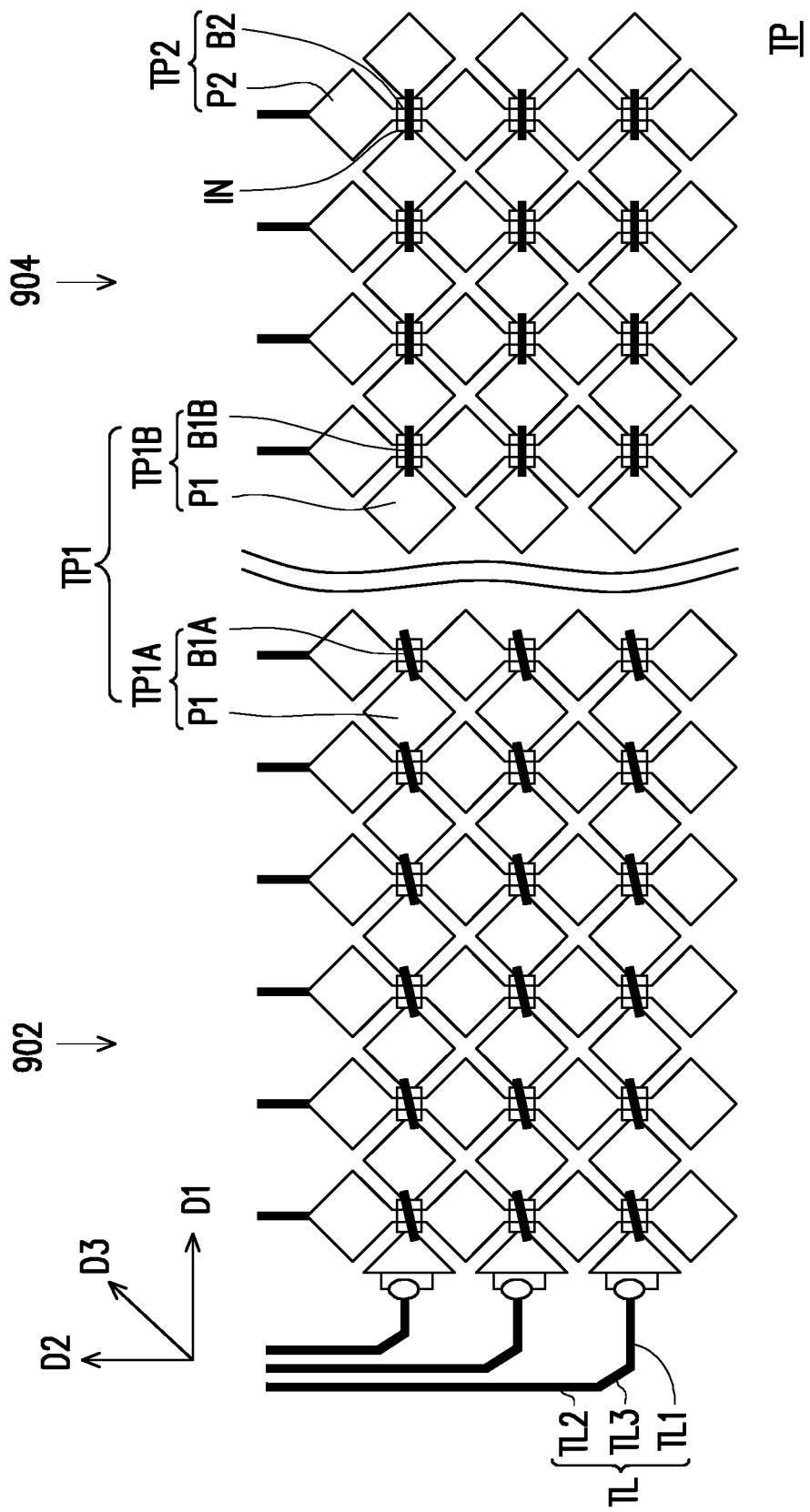
FIG. 8 is a schematic top view showing a touch sensor element for a touch display device according to an embodiment of the disclosure.

FIG. 8 is a schematic top view showing a touch sensor element for a touch display device according to an embodiment of the disclosure. Referring to FIG. 8, the touch sensor element TP suitable for being configured in a touch display device such as any of the touch display devices 100 to 500 and 700 in the previous embodiments, and includes a plurality of first touch electrodes TP1 and a plurality of second touch electrodes TP2. The first touch electrode TP1 and the second touch electrode TP2 can perform a mutual capacitive touch sensing function. One of the first touch electrode TP1 and the second touch electrode TP2 is a scan electrode (or driving electrode) and the other is a reading electrode (or sensing electrode). In the case the touch sensor element TP is disposed on an unbent substrate, each first touch electrode TP1 can extend in a first direction D1, each second touch electrode TP2 can extend in a second direction D2, and the first direction D1 can intersect with the second direction D2 on an X-Y plane. For example, the first direction D1 can be perpendicular to the second direction D2.

Figure 9:
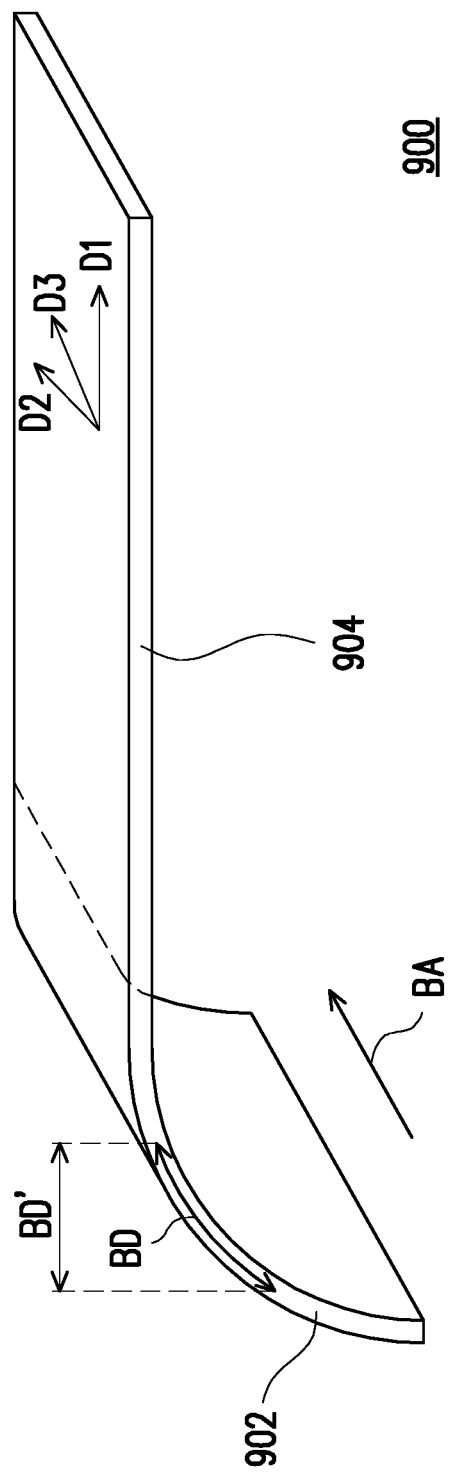
FIG. 9 is a schematic view showing a touch display device according to another embodiment of the present disclosure.

In the present embodiment, the first touch electrode TP1 can comprises a plurality of first sensing pads P1 extending along the first direction D1, a plurality of first bridges B1A and a plurality of second bridges B1B. The first touch electrodes TP1 in the bending portion 902 and those in the main portion 904 can have different structure. Referring to FIG. 8 and FIG. 9 together, the first touch electrodes TP1 in the bending portion 902 include the first sensing pads P1 and the first bridges B1A, the first touch electrodes TP1 in the main portion 904 include the first sensing pads P1 and the second bridges B1B, and the at least one of the first bridges B1A has different extending direction from the extending direction of at least one of the second bridges B1B.

The first sensing pads P1 can be connected each other by the first bridges B1A in the bending portion 902, the first sensing pads are connected by the second bridges B1B in the main portion 904, and at least one of the first bridge B1A has an extending direction different from an extending direction of at least one of the second bridge B1B. For example, in FIG. 8, the first bridges B1A have an extending direction (the third direction D3), which is different from the extending direction (the first direction D1) of the second bridges. Each second touch electrode TP2 includes a plurality of second sensing pads P2 and a neck portion B2 connecting two adjacent second sensing pads P2 arranged along the second direction D2. In addition, each neck portion B2 is isolated from the first bridge B1A or the second bridge B1B through an insulator IN so that the first touch electrode TP1 and the second touch electrode TP2 are electrically independent from each other.

In some embodiment, the first bridge B1A and the second bridge B1B extend in different directions on the X-Y plane, and specifically, the first bridge B1A can extend in a third direction D3, and the second bridge B1B can extend in the first direction D1. The third direction D3 is tilted with respect to the first direction D1 on the X-Y plane. In some embodiment, the first bridge B1A and the second bridge B1B can extend in the same direction. For example, the first bridge B1A and the second bridge B1B can extend in the third direction D3.

The touch sensor element TP can further include a plurality of transmission lines TL. Specifically, the transmission line TL includes a first direction portion TL1, a second direction portion TL2 and a third direction portion TL3 connected between the first direction portion TL1 and the second direction portion TL2. The first direction portion TL1 is connected to one first touch electrode TP1 at an end and connected to third direction portion TL3 at the other end. The extending direction of the third direction portion TL3 is intersected with either the extending direction of the first direction portion TL1 or the extending direction of the second direction portion TL2. The extending direction of the first direction portion TL1 can be parallel to the first direction D1 and the extending direction of the second direction portion TL2 can be parallel to the second direction D2, but the disclosure is not limited thereto. In an alternative embodiment, the first direction portion TL1 can be directly connected to the second direction portion TL2 without the third direction portion TL3. Alternatively, the transmission line TL can include more than three portions extending in different directions.

When the touch sensor element TP is applied to a touch display device 900 as shown in FIG. 9, the first section TP1A can be disposed on the bending portion 902 while the second section TP1B can be disposed on the main portion 904. Referring to FIG. 8 and FIG. 9 together, the main portion 904 of the touch display device 900 is substantially configured to be a flat plate parallel to an X-Y plane and the bending portion 902 is substantially configured to curve about a bending axis BA and have a curvature with respect to the main portion 904. The first direction D1 with respect to the extending direction of the first touch electrode TP1 is substantially parallel to a projection BD' of the bending direction BD of the bending portion 902 on the X-Y plane, and the second direction D2 with respect to the extending direction of the second touch electrode TP2 is substantially parallel to the bending axis BA of the bending portion 902.

When the first section TP1A of the touch sensor element TP is bent (or curved) in accordance with the bending direction BD, the extending direction of the first bridge B1A is intersected with the bending direction BD. The extending direction (the third direction D3) of the first bridge B1A is different from the bending direction BD. Thus, when the substrate is bent, the first bridge B1A in the bending portion 902 would less likely be damaged under the bending stress along the bending direction BD. Therefore, the configuration of disposing the first section TP1A of the touch sensor element TP in the bending portion 902 and disposing the second section TP1B of the touch sensor element TP in the main portion 904 is conducive to enhance the reliability of the touch sensor element TP and ensure the quality of the touch display device 900.

In addition, the transmission line TL includes the third direction portion TL3 tilted with respect to the first direction D1 in FIG. 8, and not parallel to the bending direction BD in FIG. 9, so that the transmission line TL would less likely be damaged owing to the bending stress of in the bending direction BD. Accordingly, the touch display device 900 can have better reliability and yield rate by configuring the transmission line TL with the third direction portion TL3 in the bending portion 902.

Figure 10:
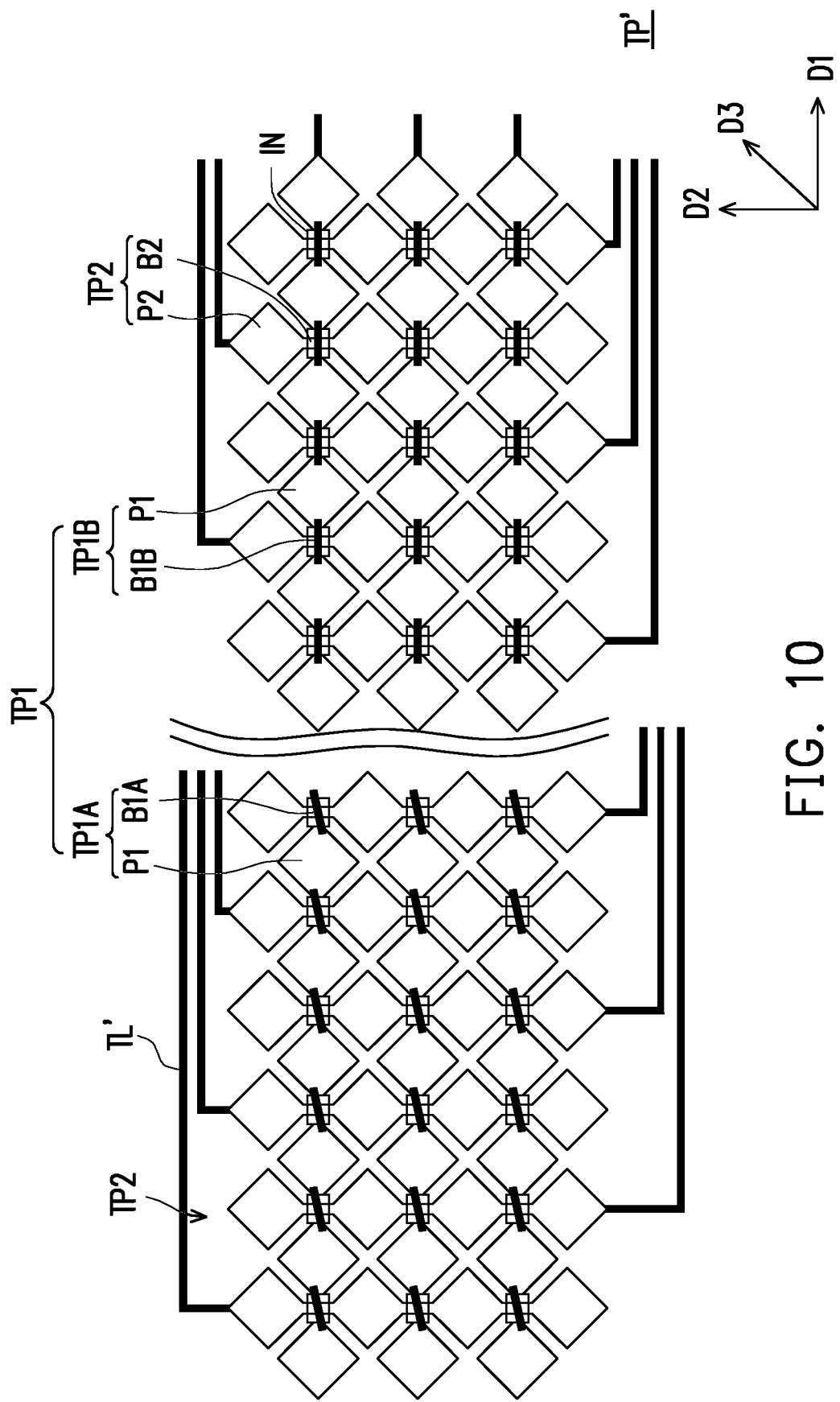
FIG. 10 is a schematic top view showing a touch sensor element for a touch display device according to another embodiment of the disclosure.

FIG. 10 is a schematic top view showing a touch sensor element for a touch display device according to another embodiment of the disclosure. Referring to FIG. 10, the touch sensor element TP' suitable for being configured in a touch display device such as any of the touch display devices 100 to 500 and 700 in the previous embodiments, and includes a plurality of first touch electrodes TP1, a plurality of second touch electrodes TP2, and a plurality of transmission line TL'. The structure design and the disposition relationship of the first touch electrode TP1 and the second touch electrode TP2 can be similar to those depicted in the embodiment of FIG. 8 and not iterated here. The transmission lines TL' are each connected with one second touch electrode TP2 in the present embodiment.

Each of the transmission lines TL' connects to the second touch electrode TP2 at one end. The transmission line TL' extend in the second direction D2 first and turns to extend in the first direction D1. In addition, some of the transmission line TL' can be disposed at one end of the second touch electrodes TP2 and the other of the transmission line TL' can be disposed at the other end of the second touch electrodes TP2.

Figure 11:
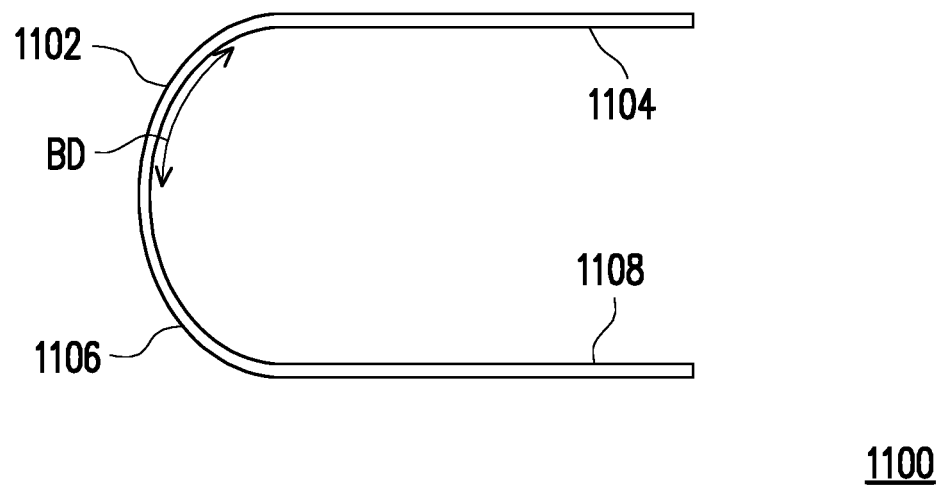
FIG. 11 schematically illustrates a touch display device according to further another embodiment of the present disclosure.

FIG. 11 schematically illustrates a touch display device according to further another embodiment of the present disclosure. Referring to FIG. 11, the touch display device 1100 can have a substrate including a first bending portion 1102, a first main portion 1104, a second bending portion 1106 and a second main portion 1108. The first bending portion 1102 and the second bending portion 1106 are located between the first main portion 1104 and the second main portion 1108 and the touch display device 1100 is folded so that the first bending portion 1102 and the second bending portion 1106 are curved, and the first main portion 1104 and the second main portion 1108 can be substantially plane and faced to each other. The touch sensor element TP' in FIG. 10 can be applied to the touch display device 1100, in a manner that the first section TP1A is disposed on the first bending portion 1102 or the second bending portion 1106 while the second section TP1B is disposed on the first main portion 1104 or the second main portion 1108.

Referring to FIG. 10 and FIG. 11, in the present embodiment, the extending direction (the third direction D3) of the first bridge B1A is not parallel to the bending direction BD when the first section TP1A is disposed on the first bending portion 1102 or the second bending portion 1106. The extending direction (the third direction D3) of the first bridge B1A is different from the bending direction BD. Therefore, when the substrate is bent, the first bridge B1A in the first or second bending portion 1102 or 1106 would not easily be damaged under the bending stress along the bending direction BD. In other words, the touch display device 1100 can have better reliability and yield rate by configuring the first section TP1A in the first bending portion 1102 or the second bending portion 1106 and configuring the second section TP1B in the first main portion 1104 or the second main portion 1108.

Figure 12:
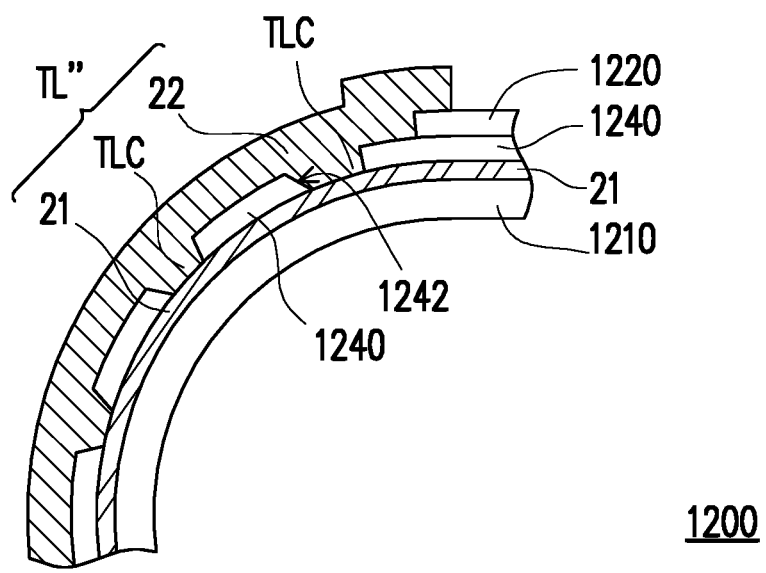
FIG. 12 is a schematic cross sectional view of a touch display device taken along a portion of a transmission line of a touch electrode in the touch display device when touch display device is in a bent status according to an embodiment of the disclosure.

FIG. 12 is a schematic cross sectional view of a touch display device taken along a portion of a transmission line in the touch display device when touch display device is in a bent status according to an embodiment of the disclosure. Referring to FIG. 12, a portion of a touch display device 1200 presented in the drawing includes a substrate 1210, a transmission line TL", a touch electrode 1220, and an insulating layer 1240. The touch electrode 1220 can be the first touch electrode or the second touch electrode as mentioned above. The transmission line TL" is connected to the touch electrode 1220, and can include a first trace portion 21 disposed on the substrate 1210, a second trace portion 22 disposed on the insulating layer 1240, and a connection portion TLC disposed between the first trace portion 21 and the second trace portion 22 and passing through the insulating layer 1240. Openings 1242 are formed in the insulating layer 1240, and the connection portion TLC is formed in the openings 1242.

As described in FIG. 6, the display layer 630 can include the driving layer 632 and a display medium layer 634. The driving layer 632 can include a gate and a source/drain electrode. The display medium layer 634 can include a first electrode, a second electrode on the first electrode, and a light emitting layer between the first electrode and the second electrode. The transmission line TL" can include a conductive layer disposed under the insulating layer 1240 to increase conductivity and reliability. In some embodiments, the first trace portion can have the same material as the gate or the source/drain. The first trace portion can be formed as the layer as the gate. Or, the first trace portion can be formed as the layer as the source or drain. In some embodiments, wherein the first trace portion can have the same material as the first electrode or the second electrode. The first trace portion can be formed as the layer as the first electrode. Or, the first trace portion can be formed as the layer as the second electrode.

By the configuration of the transmission line TL", the touch sensing signal of the touch electrode 1220 can be transmitted through the first trace portion 21, the connection portion TLC and the second trace portion 22 to a driving unit. In addition, the cross section structure of the transmission line TL" can be applied to the transmission line TL and the transmission line TL' in the previous embodiments. By means of electrical connection of the connection portion in the insulating layer and the conductive layer below the insulating layer, the transmission line TL" can be less likely damaged or broken when curved in accordance of the bending of the substrate 1210, such that the touch display device having the design of the transmission line TL" can have better reliability.

Figure 13:
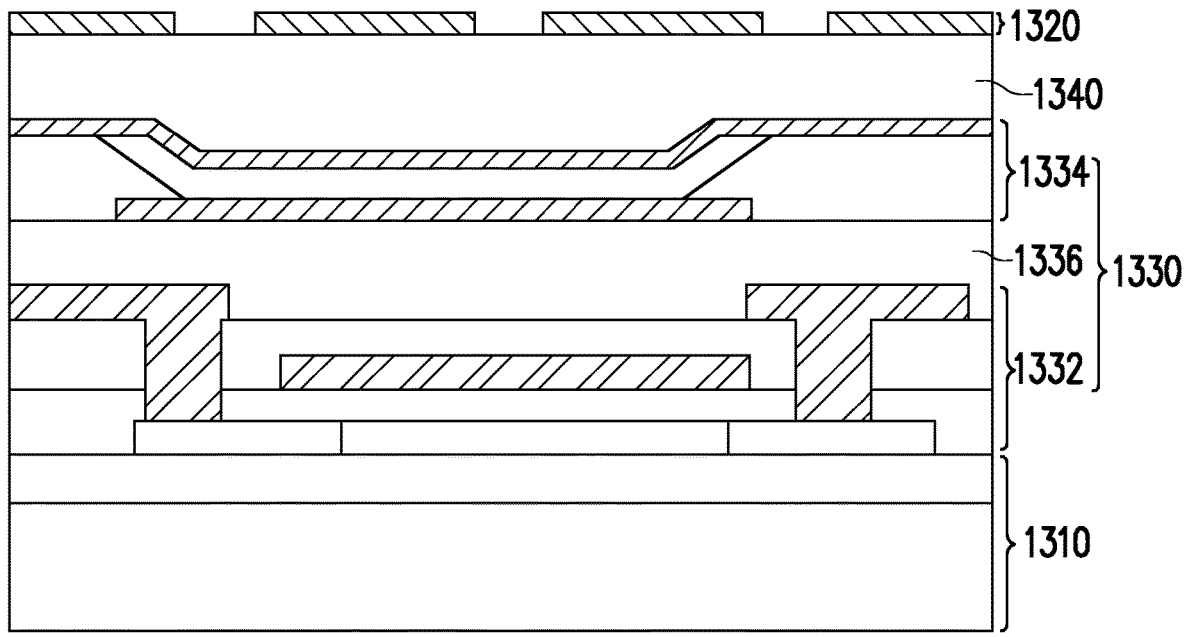
FIG. 13 is a schematic cross sectional view of a touch display device according to an embodiment of the present disclosure.
Figure 14:
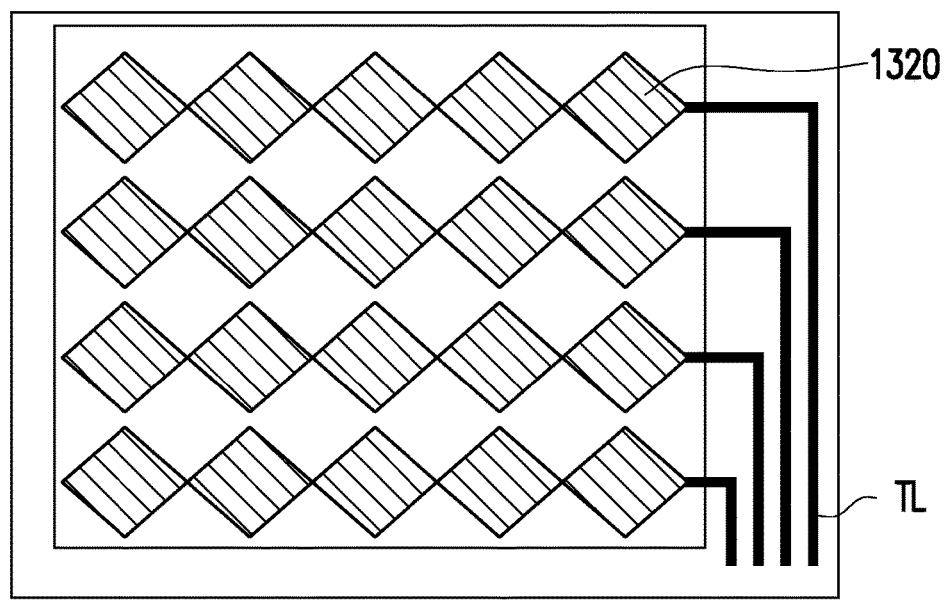
FIG. 14 schematically illustrates a top view of the first touch electrode in FIG. 13.

FIG. 13 is a schematic cross sectional view of a touch display device according to an embodiment of the present disclosure. Referring to FIG. 13, a touch display device 1300 includes a substrate 1310, a first touch electrode 1320, a display layer 1330, and an insulating layer 1340. The first touch electrode 1320 is disposed on the substrate 1310, the display layer 1330 is disposed between the first touch electrode 1320 and the substrate 1310, and the insulating layer 1340 is disposed between the first touch electrode 1320 and the display layer 1330. The display layer 1330 can include a driving layer 1332, a display medium layer 1334 and a dielectric layer 1336 between the driving layer 1332 and the display medium layer 1334. In addition, the detailed structure of the driving layer 1332 and the display medium layer 1334 can refer to the detailed descriptions of the display pixel 630P in FIG. 6 and not reiterated here. The structure shown in FIG. 13 can be on the bending portion of the substrate. FIG. 14 schematically illustrates a top view of the first touch electrode in FIG. 13. As shown in FIG. 14, the first touch electrode 1320 can be formed by a plurality of geometric patterns connecting in series and can be connected to a transmission line TL. In the present embodiment, the geometric patterns forming the first touch electrode 1320 are diamond patterns, but not limited thereto. In an alternative embodiment, the geometric patterns forming the first touch electrode 1320 can include rectangles, hexagons, octagons, circles, ovals, or other geometric patterns.

Figure 15:
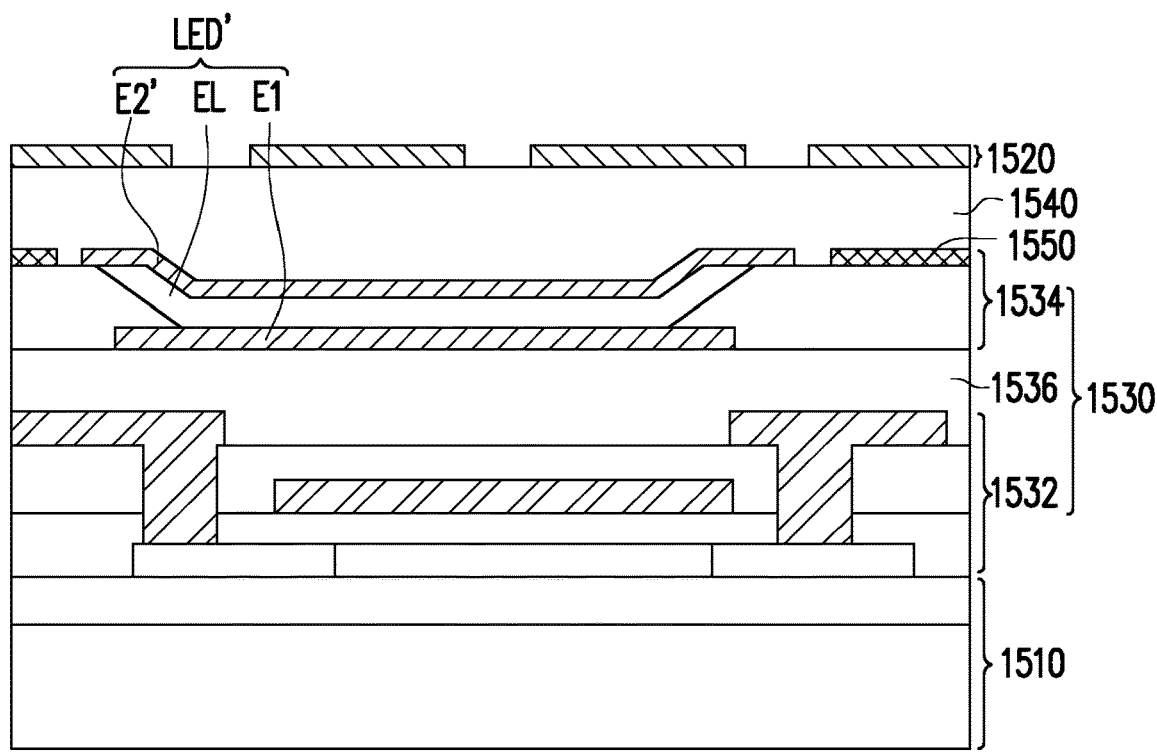
FIG. 15 is a schematic cross sectional view of a touch display device according to another embodiment of the present disclosure.

FIG. 15 is a schematic cross sectional view of a touch display device according to another embodiment of the present disclosure. Referring to FIG. 15, a touch display device 1500 includes a substrate 1510, a first touch electrode 1520, a display layer 1530, an insulating layer 1540, and a second touch electrode 1550. The first touch electrode 1520 is disposed on the substrate 1510, the display layer 1530 is disposed between the first touch electrode 1520 and the substrate 1510, and the insulating layer 1540 is disposed between the first touch electrode 1520 and the display layer 1530. The display layer 1530 can include a driving layer 1532, a display medium layer 1534 and a dielectric layer 1536 between the driving layer 1532 and the display medium layer 1534. In addition, the detail structure of the driving layer 1532 and the display medium layer 1534 can refer to the detail description of the display pixel 630P in FIG. 6, but the pattern design of the second electrode E2' of the light emitting diode structure LED' is different from that in FIG. 6. Specifically, in the present embodiment, the second touch electrode 1550 can be formed in the same layer as the second electrode E2' of the light emitting diode structure LED'. Herein, the design of the touch display device 1500 can be called as a hybrid touch display structure. The structure shown in FIG. 15 can be on the bending portion of the substrate.

Figure 16:
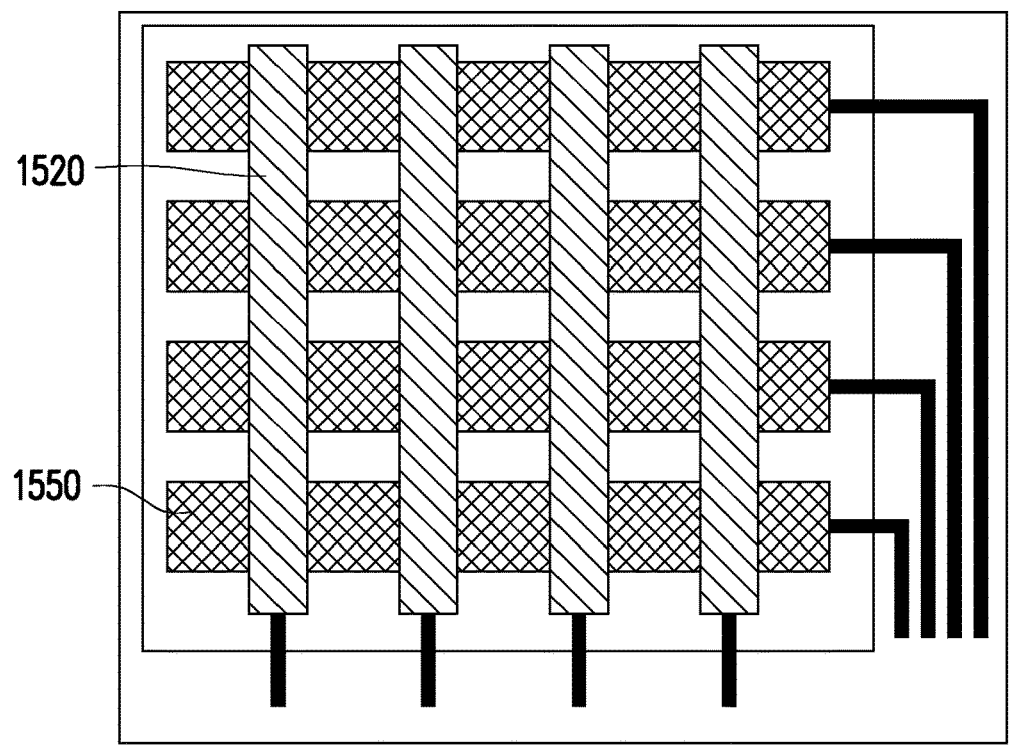
FIG. 16 schematically illustrates a top view of the first touch electrode and the second touch electrode in FIG. 15.

FIG. 16 schematically illustrates a top view of the first touch electrode and the second touch electrode in FIG. 15. As shown in FIG. 16, the first touch electrode 1520 can be formed by a stripe pattern and the second touch electrode 1550 can also be formed by a stripe pattern. In addition, the extending direction of the first touch electrode 1520 intersects the extending direction of the second touch electrode 1550. The first touch electrode 1520 and the second touch electrode can perform a mutual capacitive touch sensing function by capacitive coupling to each other.

In view of the above, the touch display device has a bending portion configured with the display layer and the touch electrode, such that the bending portion can provide both the display function and the touch sensing function. In addition, the touch electrode disposed in the bending portion can be designed have a structure less likely be damaged by the bending stress. Accordingly, the touch display device can have better reliability.

It will be apparent to those skilled in the art that various modifications and variations can be made to the structure of the present invention without departing from the scope or spirit of the disclosure. In view of the foregoing, it is intended that the present invention cover modifications and variations of this invention provided they fall within the scope of the following claims and their equivalents.

What is claimed is:

1. A display device, comprising:
    a substrate comprising a first bending portion;
    a display layer disposed on the substrate;
    an insulating layer disposed on the substrate; and
    a conductive line disposed on the substrate, wherein the conductive line comprises:
        a first trace disposed on the substrate; and
        a second trace disposed on the first trace;
    wherein the insulating layer is disposed between the first trace and the second trace;
        wherein the second trace comprises a plurality of connection parts passing through the insulating layer and connected to the first trace, and one of the plurality of connection parts is adjacent to another one of the plurality of connection parts; and
        wherein a portion of the first trace continuously extends from the one of the plurality of connection parts to the another one of the plurality of connection parts, and a portion of the second trace continuously extends from the one of the plurality of connection parts to the another one of the plurality of connection parts.

2. The display device according to claim 1, wherein the insulating layer comprises an organic layer and an inorganic layer disposed on the organic layer.

3. The display device according to claim 2, wherein a greatest thickness of the organic layer is a first thickness, a greatest thickness of the inorganic layer is a second thickness, and the first thickness is greater than the second thickness.

4. The display device according to claim 2, wherein the organic layer covers a side edge of a display medium layer of the display layer, and the inorganic layer covers a side edge of the organic layer.

5. The display device according to claim 1, wherein the substrate comprises a main portion, the first bending portion is located at a side of the main portion, and a greatest curvature of the first bending portion is greater than a greatest curvature of the main portion.

6. The display device according to claim 5, wherein the substrate further comprises a second bending portion located at another side of the main portion, and a greatest curvature of the second bending portion is greater than a greatest curvature of the main portion.

7. The display device according to claim 5, wherein the display layer and the insulating layer are disposed on the main portion.

8. The display device according to claim 5, further comprising a first touch electrode disposed on the insulating layer.

9. The display device according to claim 8, further comprising a second touch electrode, wherein the second touch electrode is disposed between the insulating layer and the substrate.

10. The display device according to claim 8, wherein the first touch electrode comprises a plurality of first sensing pads arranged along a first direction, a plurality of first bridges and a plurality of second bridges, wherein the first sensing pads are connected by the first bridges in the first bending portion, the first sensing pads are connected by the second bridges in the main portion, and at least one of the first bridges has an extending direction different from an extending direction of at least one of the second bridges.

11. The display device according to claim 10, wherein the extending direction of the at least one of the first bridges is different from a bending direction of the first bending portion.

12. The display device according to claim 1, wherein the display layer comprises a driving layer, and the driving layer comprises a gate and a source/drain, wherein the first trace has a same material as the gate or the source/drain.

13. The display device according to claim 1, wherein the display layer comprises a display medium layer, and the display medium layer comprises a first electrode, a second electrode, and a light emitting layer between the first electrode and the second electrode, wherein the first trace has the same material as the first electrode or the second electrode.

14. A touch display device, comprising:
    a substrate comprising a first bending portion;
    a touch electrode disposed on the substrate;
    a display layer disposed on the substrate, wherein on the first bending portion of the substrate, the display layer is disposed between the substrate and the touch electrode;
    an insulating layer disposed on the substrate; and
    a conductive line connected to the touch electrode, wherein the conductive line comprises:
        a first trace disposed on the substrate; and
        a second trace disposed on the first trace;
        wherein the insulating layer is disposed between the first trace and the second trace;
        wherein the second trace comprises a plurality of connection parts passing through the insulating layer and connected to the first trace, and one of the plurality of connection parts is adjacent to another one of the plurality of connection parts; and
        wherein a portion of the first trace continuously extends from the one of the plurality of connection parts to the another one of the plurality of connection parts, and a portion of the second trace continuously extends from the one of the plurality of connection parts to the another one of the plurality of connection parts.

15. The touch display device according to claim 14, wherein the display layer is disposed between the substrate and the touch electrode, and the insulating layer is disposed between the display layer and the touch electrode.

16. The touch display device according to claim 14, wherein the conductive line further comprises a first direction portion, a second direction portion and a third direction portion connected between the first direction portion and the second direction portion, and an extending direction of the third direction portion is intersected with either an extending direction of the first direction portion or an extending direction of the second direction portion, and wherein the first direction portion, the second direction portion and the third direction portion are formed in the same layer.

17. The touch display device according to claim 14, wherein the insulating layer comprises an organic layer and an inorganic layer disposed on the organic layer.

18. The touch display device according to claim 17, wherein a greatest thickness of the organic layer is a first thickness, a greatest thickness of the inorganic layer is a second thickness, and the first thickness is greater than the second thickness.

19. The touch display device according to claim 17, wherein the organic layer covers a side edge of a display medium layer of the display layer, and the inorganic layer covers a side edge of the organic layer.

20. The touch display device according to claim 14, further comprising a second touch electrode, wherein the second touch electrode is disposed between the insulating layer and the flexible substrate.

* * * * *